US012660667B2

(12) United States Patent
Kang et al.

(10) Patent No.: US 12,660,667 B2
(45) Date of Patent: Jun. 16, 2026

(54) HYBRID BONDING APPARATUS AND HYBRID BONDING METHOD USING THE SAME

(71) Applicant: HANWHA PRECISION MACHINERY CO., LTD., Changwon-si (KR)

(72) Inventors: Tae Woo Kang, Changwon-si (KR); Ji Hwan Bae, Changwon-si (KR); Yong Jun Kim, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 883 days.

(21) Appl. No.: 17/889,937

(22) Filed: Aug. 17, 2022

(65) Prior Publication Data

US 2023/0087198 A1     Mar. 23, 2023

(30) Foreign Application Priority Data

Sep. 23, 2021     (KR) ........................ 10-2021-0125872

(51) Int. Cl.
    *H01L 23/00*        (2006.01)
    *H10W 72/00*        (2026.01)
         (Continued)

(52) U.S. Cl.
    CPC ........ *H10W 72/011* (2026.01); *H10W 72/019* (2026.01); *H10W 72/077* (2026.01);
         (Continued)

(58) Field of Classification Search
    CPC ......... H01L 24/74; H01L 24/80; H01L 24/05; H01L 24/08; H01L 2224/05647;
         (Continued)

(56) References Cited

U.S. PATENT DOCUMENTS 9,142,532 B2     9/2015  Suga et al.
9,446,467 B2 *   9/2016  Huang ................. B23K 1/0016
         (Continued)

FOREIGN PATENT DOCUMENTS

CN        107993927  A     5/2018
KR      10-0936778  B1     1/2010
         (Continued)

OTHER PUBLICATIONS

Communication dated Jul. 14, 2023 issued by Korean Intellectual Property Office in counterpart Korean Application No. 10-2021-0125872.

*Primary Examiner* — Ermias T Woldegeorgis
(74) *Attorney, Agent, or Firm* — Sughrue Mion, PLLC

(57)                ABSTRACT

Provided is a hybrid bonding apparatus including a plurality of chambers, and a transferer configured to transfer a plurality of wafers between the plurality of chambers and transfer a plurality of bonded wafers to an annealing chamber, the plurality of wafers including a plurality of substrate wafers and a plurality of die supply wafers, wherein the plurality of chambers respectively includes a wafer supplier configured to store the plurality of wafers, a bonding device configured to bond the plurality of wafers, the bonding device including a bonder configured to bond dies on the plurality of substrate wafers from the plurality of die supply wafers, and a pre-annealing oven configured to primarily anneal the plurality of substrate wafers, and a processor.

17 Claims, 6 Drawing Sheets

(51) Int. Cl.
| | | |
|---|---|---|
| *H10W 72/90* | (2026.01) | |
| *H10W 80/00* | (2026.01) | |
| *H10W 90/00* | (2026.01) | |

(52) U.S. Cl.
CPC ........ *H10W 72/952* (2026.01); *H10W 72/953* (2026.01); *H10W 80/016* (2026.01); *H10W 80/301* (2026.01); *H10W 90/791* (2026.01)

(58) Field of Classification Search
CPC . H01L 2224/05687; H01L 2224/08221; H01L 2224/80012; H01L 2224/80908; H01L 2224/80948; H01L 2224/80986; H01L 2224/86896; H01L 2224/86897; H01L 2924/35121; H01L 21/67103; H01L 21/67144; H01L 21/67051; H01L 21/67132; H01L 21/67766; H10W 72/011; H10W 72/019; H10W 72/077; H10W 72/952; H10W 72/953; H10W 80/016; H10W 80/301; H10W 90/791; H10P 72/0446; H10P 72/0442; H10P 72/0432; H10P 72/0414; H10P 72/3402
See application file for complete search history.

(56) References Cited

U.S. PATENT DOCUMENTS

| | | | |
|---|---|---|---|
| 10,672,820 | B2 | 6/2020 | Tsai |
| 11,063,008 | B2 | 7/2021 | Lin et al. |

FOREIGN PATENT DOCUMENTS

| | | | |
|---|---|---|---|
| KR | 10-2014-0005743 | A | 1/2014 |
| KR | 10-2015-0006845 | A | 1/2015 |
| KR | 10-2021-0066770 | A | 6/2021 |
| KR | 10-2021-0087200 | A | 7/2021 |

\* cited by examiner

FIG. 2

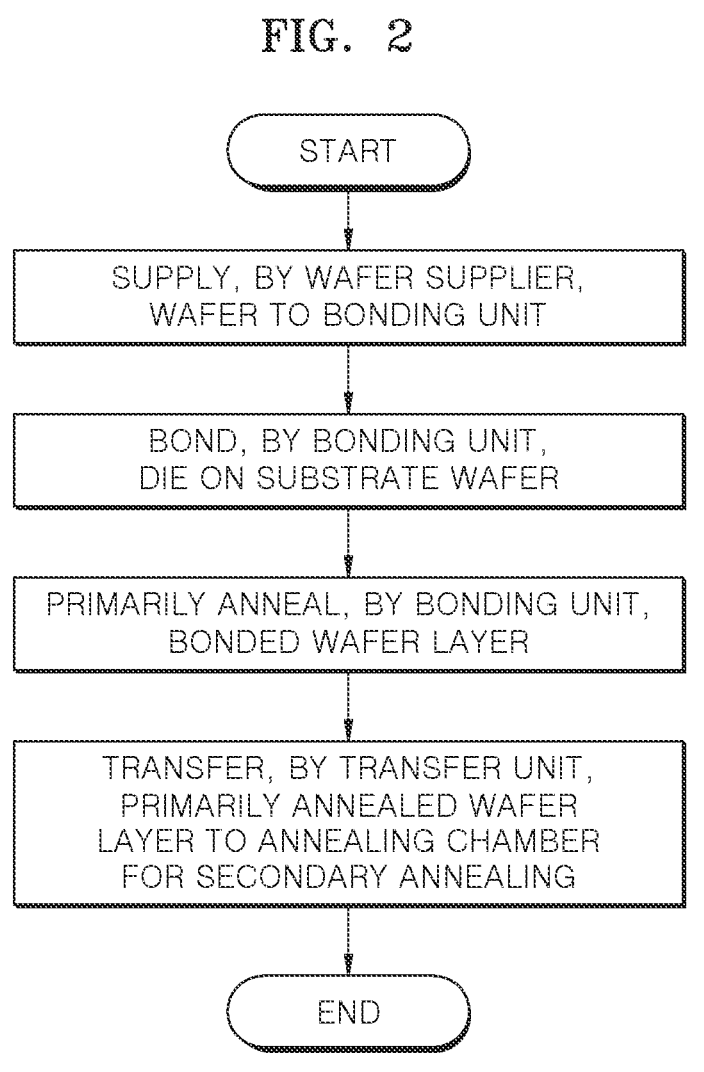

START

↓

SUPPLY, BY WAFER SUPPLIER,
WAFER TO BONDING UNIT

↓

BOND, BY BONDING UNIT,
DIE ON SUBSTRATE WAFER

↓

PRIMARILY ANNEAL, BY BONDING UNIT,
BONDED WAFER LAYER

↓

TRANSFER, BY TRANSFER UNIT,
PRIMARILY ANNEALED WAFER
LAYER TO ANNEALING CHAMBER
FOR SECONDARY ANNEALING

↓

END

FIG. 3

HYBRID BONDING APPARATUS AND HYBRID BONDING METHOD USING THE SAME

CROSS-REFERENCE TO RELATED APPLICATION

This application claims priority to Korean Patent Application No. 10-2021-0125872, filed on Sep. 23, 2021, in the Korean Intellectual Property Office, the disclosure of which is incorporated by reference herein in its entirety.

BACKGROUND

1. Field

Embodiments of the disclosure relate to a hybrid bonding apparatus and a hybrid bonding method using the same, and more particularly, to an apparatus and method using copper-silicon dioxide ($Cu—SiO_2$) hybrid bonding.

2. Description of Related Art

A bonding process is a process of bonding a wafer chip and a substrate in a semiconductor manufacturing process. Bonding methods include die bonding for directly attaching a front surface of a die to a substrate, wire bonding using a wire, flip chip bonding for forming bumps on a rear surface of a chip and connecting the chip to a substrate, thermo-compression bonding for individually peeling off a semi-conductor chip on a wafer substrate, turning over the semi-conductor chip, applying flux to bumps, and then pressing the semiconductor chip on the substrate, etc. Recently, hybrid bonding in which primary bonding is performed between silicon dioxide ($SiO_2$) layers by using van der Waals force, and copper-copper ($Cu—Cu$) secondary bonding is performed by using thermal expansion of a copper element filled in a via hole by applying heat at a high temperature through an annealing process is being used.

A copper-silicon dioxide ($Cu—SiO_2$) hybrid bonding process may be operated with low force and at a low temperature, and thus, the productivity of a bonding equipment may be increased, and the bonding position precision may be increased, and thus, a high-performance semiconductor chip with a larger number of pitches may be stacked. However, because the process is performed at a low temperature, when a semiconductor chip is bonded only by $SiO_2$ primary bonding and bonding force is not strong enough, a chip fly phenomenon in which a chip is detached may occur.

SUMMARY

The disclosure is directed to providing a hybrid bonding apparatus capable of increasing productivity and mounting precision through pre-annealing after primary bonding in a hybrid bonding process, and a hybrid bonding method using the hybrid bonding apparatus.

However, the objective of disclosure is not limited thereto.

Additional aspects will be set forth in part in the description which follows and, in part, will be apparent from the description, or may be learned by practice of the presented embodiments of the disclosure.

Accordingly, to an aspect of an embodiment, there is provided a hybrid bonding apparatus including a plurality of chambers, and a transferer configured to transfer a plurality of wafers between the plurality of chambers and transfer a plurality of bonded wafers to an annealing chamber, the plurality of wafers including a plurality of substrate wafers and a plurality of die supply wafers, wherein at least one of the plurality of chambers includes a wafer supplier configured to store the plurality of wafers, a bonding device configured to bond the plurality of wafers, the bonding device including a bonder configured to bond dies on the plurality of substrate wafers from the plurality of die supply wafers, and a pre-annealing oven configured to primarily anneal the plurality of substrate wafers, and a processor.

The bonding device may include a plurality of bonding devices, and when a bonding process is performed by a bonder included in a bonding device among the plurality of bonding devices, a primary annealing process may be simultaneously performed by a pre-annealing oven included in another bonding device among the plurality of bonding devices.

The bonding process and the primary annealing process simultaneously performed by different bonding devices may be completed at the same time.

The bonding device may include a first bonding device and a second bonding device, and the processor may be configured to predict a time at which the bonding process is completed by the first bonding device, and control a condition of the primary annealing process such that the primary annealing process is completed by the second bonding device based on an expected bonding completion time.

The bonding may be copper-silicon dioxide ($Cu—SiO_2$) hybrid bonding.

The primarily annealing may be performed at a predetermined temperature and for a predetermined time, and the predetermined temperature may be lower than a temperature of secondary annealing in the annealing chamber, and the predetermined time may be shorter than a time of the secondary annealing.

The plurality of chambers respectively may further include a pretreatment device configured to pretreat a plurality of bonded substrate wafers to be activated, and a cleaner configured to clean the plurality of substrate wafers.

The bonding device may be further configured to bond and primarily anneal the dies on the plurality of substrate wafers from the plurality of die supply wafers pretreated and cleaned by the pretreatment device and the cleaner, and the pretreatment device and the cleaner may be respectively configured to pretreat and clean the plurality of primarily annealed substrate wafers.

The transferer may be configured to stack the plurality of primarily annealed substrate wafers in a plurality of layers, and transfer the plurality of substrate wafers to the annealing chamber for secondary annealing.

The pre-annealing oven may include an inspection device configured to check mounting precision of the plurality of substrate wafers or check presence of foreign materials during the primarily annealing.

According to another aspect of an embodiment, there is provided a hybrid bonding method including supplying, by a wafer supplier, a plurality of wafers including a plurality of substrate wafers and a plurality of die supply wafers to a bonding device, bonding, by the bonding device, dies on the plurality of substrate wafers from the plurality of die supply wafers, primarily annealing, by the bonding device, the plurality of bonded substrate wafers, and transferring, by a transferer, the plurality of primarily annealed substrate wafers to an annealing chamber for secondary annealing.

The bonding device may include a plurality of bonding devices, and the bonding and the primarily annealing may be simultaneously performed by different bonding devices among the plurality of bonding devices.

The bonding and the primary annealing simultaneously performed by the different bonding devices may be completed at the same time.

The bonding device may include a first bonding device and a second bonding device, and the hybrid bonding method may further include predicting, by processor, a time at which the bonding is completed by the first bonding device, and controlling a condition of the primary annealing such that the primary annealing is completed by the second bonding device based on an expected bonding completion time.

The bonding may be copper-silicon dioxide ($Cu—SiO_2$) hybrid bonding.

The primarily annealing may be performed at a predetermined temperature and for a predetermined time, and the predetermined temperature may be lower than a temperature of secondary annealing, and the predetermined time may be shorter than a time for the secondary annealing.

The hybrid bonding method may further include pretreating, by a pretreatment device, the plurality of primarily annealed substrate wafers to be activated, and cleaning, by a cleaner, the plurality of substrate wafers.

Before the bonding, the hybrid bonding method may further include pretreating, by the pretreatment device, the plurality of die supply wafers and cleaning, by the cleaner, the plurality of pretreated die supply wafers, the bonding may include bonding the plurality of pretreated and cleaned die supply wafers to the plurality of substrate wafers, and after the primarily annealing, the hybrid bonding method may further include pretreating, by the pretreatment device, the plurality of substrate wafers and cleaning, by the cleaner, the plurality of pretreated substrate wafers.

The hybrid bonding method may further include stacking, by the transferer, the plurality of primarily annealed substrate wafers in a plurality of layers and transferring the plurality of stacked substrate wafers to the annealing chamber for secondary annealing.

The primarily annealing may further include performing, by the bonding device, inspection by checking mounting precision of the plurality of substrate wafers and checking presence of foreign materials.

BRIEF DESCRIPTION OF DRAWINGS

The above and other aspects, features, and advantages of certain embodiments of the disclosure will be more apparent from the following description taken in conjunction with the accompanying drawings, in which:

FIG. 2 illustrates a hybrid bonding method according to an embodiment of the disclosure; and FIGS. 3, 4, 5, and 6 illustrate a hybrid bonding process according to an embodiment of the disclosure.

DETAILED DESCRIPTION

Figure 1:
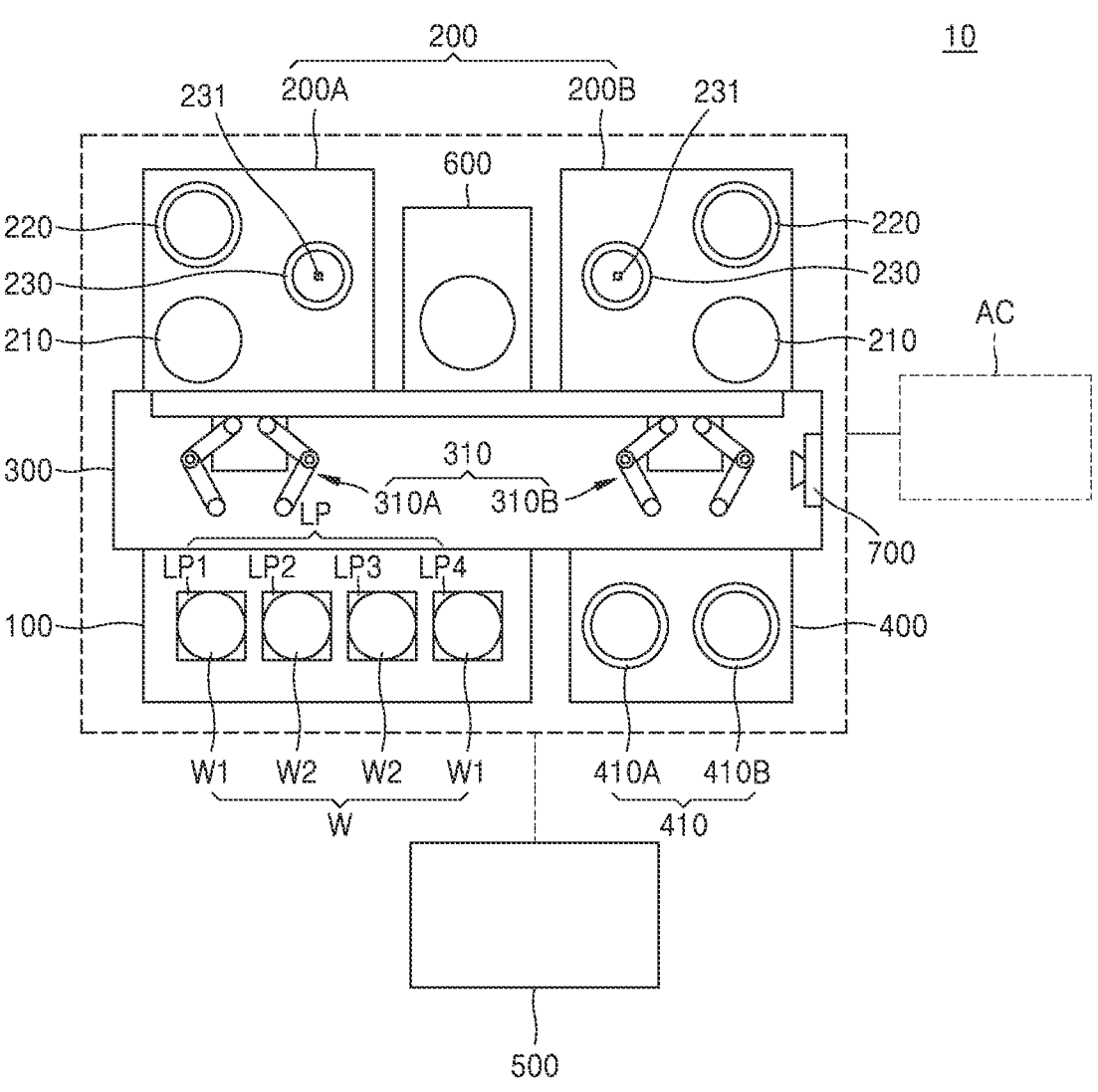
FIG. 1 illustrates a hybrid bonding apparatus according to an embodiment of the disclosure.

Reference will now be made in detail to embodiments, examples of which are illustrated in the accompanying drawings, wherein like reference numerals refer to like elements throughout. Embodiments described herein are example embodiments, and thus, the disclosure is not limited thereto. In this regard, the embodiments of the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The disclosure may have various modifications and various embodiments, and specific embodiments are illustrated in the drawings and are described in detail in the detailed description. However, this is not intended to limit the disclosure to particular embodiments, and it will be understood that all changes, equivalents, and substitutes that do not depart from the spirit and technical scope of the disclosure are encompassed in the disclosure. In the description of the disclosure, even though elements are illustrated in other embodiments, like reference numerals are used to refer to like elements.

Hereinafter, embodiments of the disclosure will be described in detail with reference to the accompanying drawings, and in the following description with reference to the drawings, like reference numerals refer to like elements and redundant descriptions thereof will be omitted.

Although the terms "first," "second," etc. may be used to describe various elements, these elements should not be limited by these terms. These terms are only used to distinguish one element from another.

An expression used in the singular encompasses the expression of the plural, unless it has a clearly different meaning in the context.

It will be understood that the terms "comprise," "comprising," "include" and/or "including" as used herein specify the presence of stated features or elements but do not preclude the addition of one or more other features or elements.

Sizes of elements in the drawings may be exaggerated or reduced for convenience of explanation. In other words, because sizes and thicknesses of elements in the drawings are arbitrarily illustrated for convenience of explanation, the disclosure is not necessarily limited thereto.

The x-axis, the y-axis and the z-axis are not limited to three axes of the rectangular coordinate system, and may be interpreted in a broader sense. For example, the x axis, the y axis, and the z axis may be perpendicular to one another or may represent different directions that are not perpendicular to one another.

In the case where a certain embodiment may be implemented differently, a specific process order may be performed in the order different from the described order. As an example, two processes that are successively described may be substantially simultaneously performed or performed in the order opposite to the order described.

The terms, including annealing, used herein are only used to describe particular embodiments and are not intended to limit the scope of the disclosure. It will be understood that the terms "comprise," "comprising," "include" and/or "including" as used herein specify the presence of stated features, numbers, steps, operations, elements, parts, and combinations thereof, but do not preclude in advance the presence or addition of one or more other features, numbers, steps, operations, elements, parts, combinations thereof.

FIG. 1 illustrates a hybrid bonding apparatus 10 according to an embodiment of the disclosure, FIG. 2 illustrates a hybrid bonding method according to an embodiment of the disclosure, and FIGS. 3 to 6 illustrate a hybrid bonding process according to an embodiment of the disclosure.

According to an embodiment of the disclosure, the hybrid bonding apparatus 10 is an apparatus used for manufacturing a semiconductor wafer, and in particular, may be used for bonding semiconductor chips (or dies) to a substrate. In an embodiment, the hybrid bonding apparatus 10 may be an apparatus for performing copper-silicon dioxide ($Cu$—$SiO_2$) hybrid bonding.

Referring to FIG. 1, according to an embodiment of the disclosure, the hybrid bonding apparatus 10 may include a plurality of chambers and a transfer unit (transferer) 300. In this case, the chamber is an area or region that is separated from other areas, and does not need to be distinguished from other chambers, and at least a portion of the chamber may be in an open state. For example, as shown in FIG. 1, when viewed from the top, the plurality of chambers may be a plurality of work areas separated from each other.

In an embodiment, the plurality of chambers may each include a wafer supplier 100, a bonding device 200, a cleaner 400, a controller 500, a pretreatment device 600, and an aligner 700.

The wafer supplier 100 may store a plurality of wafers W. For example, the wafers W may include a plurality of die supply wafers W1 and a plurality of substrate wafers W2. Sizes and types of die supply wafers W1 and substrate wafers W2 are not particularly limited. For example, a die supply wafer W1 may be a wafer having a diameter of 300 mm, and a substrate wafer W2 may be a wafer having a diameter of 400 mm. In addition, the wafers W may be supplied from the outside of the hybrid bonding apparatus 10.

In an embodiment, the wafer supplier 100 may include a load port LP for storing a plurality of wafers W different from each other. For example, the wafer supplier 100 includes four load ports LP1, LP2, LP3, and LP4, and two of the load ports LP may be used to store the die supply wafers W1 and the other two of the load ports LP may be used to store the substrate wafers W2. However, the number of load ports LP for the die supply wafers W1 and the substrate wafers W2 may not be equal, and the number of load ports LP may be appropriately adjusted.

The bonding device 200 may perform a bonding process by receiving the wafers W from the wafer supplier 100. For example, the bonding device 200 may pick up a die D from the substrate wafer W2 while supporting the die supply wafer W1 on one side thereof, and bond the die D to the die supply wafer W1.

In an embodiment, the bonding device 200 may include a picker 210, a bonder 220, and a pre-annealing oven 230.

Figure 4:
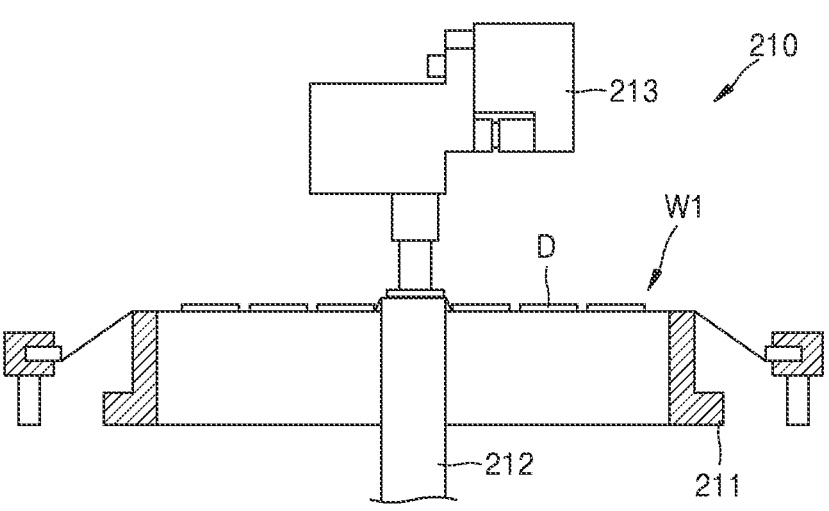

The picker 210 may pick up the die D from the die supply wafer W1. In more detail, as shown in FIG. 4, the picker 210 may include a supporter 211, an ejector 212, and a picking member 213. In this case, the die supply wafer W1 may have undergone a dicing process, and the dicing process may be performed by a separate apparatus provided outside the hybrid bonding apparatus 10. According to another embodiment, the hybrid bonding apparatus 10 may include a dicing apparatus.

The supporter 211 is a member supporting the die supply wafer W1 and may include a supporter for supporting edges of the die supply wafer W1 and a fixer for fixing both ends of an adsorption member (e.g., a tape, etc.) that fixes the die D. A shape of the supporter 211 is not particularly limited, and any sizes may be sufficient for the supporter 211 to have a flat surface supporting the die supply wafer W1 on an upper surface thereof. In addition, the supporter 211 may have an empty space therein to enable the ejector 212 to move up and down.

The ejector 212 moves up and down under the supporter 211 and presses the die D to be picked up. For example, as shown in FIG. 4, the ejector 212 may be a rod-shaped member including a presser or a protrusion corresponding to a size of the die D, and presses the die D to be picked up, upward under the die D. Accordingly, the die D may be peeled off on the adsorption member.

The picking member 213 may support and pick up the die D peeled off by the ejector 212. For example, the picking member 213 may peel off the die D by adsorbing an upper surface of the die D though an adsorption hole.

The bonder 220 bonds the die D picked up by the picker 210 to the substrate wafer W2. For example, the bonder 220 may primarily bond the die D to the substrate wafer W2 by using van der Waals force between $SiO_2$ by pressing the die D on the substrate wafer W2.

Figure 5:
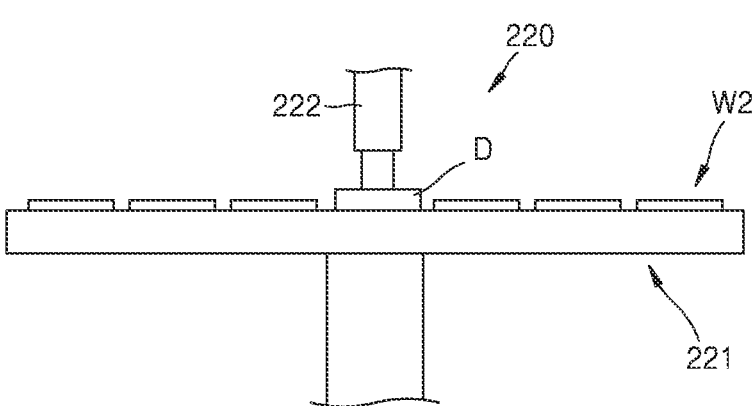

In an embodiment, referring to FIG. 5, the bonder 220 may include a supporter 221 and a bonding member 222.

Similar to the supporter 211 of the picker 210, the supporter 221 may include a support surface on which the substrate wafer W2 is mounted. In an embodiment, the supporter 221 may rotate the substrate wafer W2 mounted on an upper surface thereof by rotating on a rotation axis.

The bonding member 222 presses the picked-up die D on the substrate wafer W2 while supporting the die D. For example, the bonding member 222 moves to a position to be bonded in the substrate wafer W2 while supporting the die D through an adsorption hole or a gripper, and then descends. Then, the bonding member 222 bonds the die D by pressing the substrate wafer W2 with a predetermined pressure.

In an embodiment, the bonding member 222 may be used in a hybrid bonding process. For example, hybrid bonding may be a bonding method of simultaneously bonding a metal and an oxide or a metal and a polymer. When the bonding member 222 presses the die D on the substrate wafer W2, an oxide (e.g., $SiO_2$) on the substrate wafer W2 and an oxide (e.g., $SiO_2$) on the die D may be bonded to each other. In this case, the bond between the oxides may be a covalent bond by van der Waals force. In an embodiment, the bonding member 222 may press the die D under room temperature. Thereafter, when an annealing process is performed, dielectrics (e.g., $Cu$) of the substrate wafer W2 and the die D expand in a via hole and form a metal bond with each other.

In an embodiment, the bonding member 222 may perform a bonding process until dies D are bonded to all areas to be bonded on the substrate wafer W2. The pre-annealing oven 230 may be arranged to be spaced apart from the bonder 220 and may anneal the substrate wafer W2 to which the die D is primarily bonded by the bonder 220. In a hybrid bonding process of the related art, an annealing process is performed by pressing a die on a substrate wafer, primarily bonding the die to the substrate wafer, and then stacking the same. However, during primary bonding, because the die and the substrate wafer are bonded only by covalent bonding between oxides, bonding force is relatively weak. Accordingly, there is a problem in that a chip fly phenomenon in which a bonded die is detached from a wafer during a stacking process, a transfer process, or an annealing process occurs.

According to an embodiment of the disclosure, in the hybrid bonding apparatus 10, the bonding device 200 includes the pre-annealing oven 230 in order to solve such a problem. In more detail, the pre-annealing oven 230 may perform primary annealing on the substrate wafer W2, to which the die D is primarily bonded, before an annealing process is performed by an annealing chamber AC to be described below, and thus, chip fly may be prevented.

In an embodiment, the pre-annealing oven 230 may perform primary annealing at a predetermined temperature and for a predetermined time so that chip fly does not occur in subsequent processes after the primary annealing process is performed. In more detail, a temperature of the primary annealing performed by the pre-annealing oven 230 may be lower than a temperature of secondary annealing by the annealing chamber AC, and a time for the primary annealing may be shorter than a time for the secondary annealing. For example, the primary annealing may be performed at about 100° C. to 150° C. for about 5 minutes to about 10 minutes. According to another embodiment, the primary annealing may be performed at 120° C. for 10 minutes.

Through the configuration as described above, according to the embodiments of the disclosure, in the hybrid bonding apparatus 10, the die D is prevented from being detached from the substrate wafer W2 in subsequent processes after bonding, and thus, productivity may be increased.

In an embodiment, the pre-annealing oven 230 may include an inspection device 231. In more detail, as shown in FIG. 1, the inspection device 231 may be a member provided in the pre-annealing oven 230. In addition, the inspection device 231 may check mounting precision of the substrate wafer W2 or check the presence of foreign materials while the pre-annealing oven 230 performs the primary annealing process.

Through the configuration as described above, according to the embodiments of the disclosure, in the hybrid bonding apparatus 10, after the bonding process is performed by the bonder 220, the bonder 220 may not check the mounting precision or check the presence of foreign materials, but rather, such a process may be performed by the pre-annealing oven 230. Accordingly, the time required for the bonding process to be performed by the bonder 220 may be significantly reduced, and productivity may be increased by simultaneously performing the primary annealing process and the process of checking the mounting precision and checking the presence of foreign materials.

The type of inspection device 231 is not particularly limited, and a known inspection apparatus, such as a laser inspection apparatus, an optical inspection apparatus, or an ultrasonic inspection apparatus, may be used.

In an embodiment, a plurality of bonding devices 200 may be provided. In addition, when the bonding process is performed by a bonder 220 included in one bonding device 200, the primary annealing process may be performed by a pre-annealing oven 230 included in another bonding device 200.

In more detail, each bonding device 200 may include a picker 210, a bonder 220, and a pre-annealing oven 230. In addition, the bonder 220 included in the bonding device 200 bonds the die D to the substrate wafer W2, the pre-annealing oven 230 included in the other bonding device 200 may primarily anneal the bonded substrate wafer W2. In this case, the bonding process and the primary annealing process may be performed simultaneously.

Through the configuration as described above, according to the embodiments of the disclosure, in the hybrid bonding apparatus 10, the plurality of bonding devices 200 simultaneously perform the bonding process and the primary annealing process, respectively, and thus, productivity may be further increased. For example, during the bonding process, the die supply wafer W1 stored in the wafer supplier 100 may be used, and during the primary annealing process, the bonded substrate wafer W2 may be used. In this case, when the bonding process is simultaneously performed by the plurality of bonding devices 200, there may be a case where the die supply wafers W1 stored in the wafer supplier 100 are temporarily insufficient, and accordingly, the entire hybrid bonding process may be delayed. According to the embodiments of the disclosure, in the hybrid bonding apparatus 10, each of the bonding devices 200 performs the bonding process or the primary annealing process, but by removing time for performing the bonding process and the primary annealing process from overlapping each other or significantly reducing an overlapping time, such a delay time may be reduced.

The number of bonding devices 200 is not particularly limited, and two or more bonding devices 200 may be provided.

In an embodiment, the bonding process and the primary annealing process simultaneously performed by different bonding devices 200 may be completed simultaneously. In more detail, the time at which the bonding process is completed by a bonder 220 of one bonding device 200, and the time at which the primary annealing process is completed by a pre-annealing oven 230 of another bonding device 200 may be the same.

Accordingly, the bonding process and the primary annealing process may be repeated without a time difference in each of the bonding devices 200.

In an embodiment, when the bonding process is completed by one bonding device 200, the bonding device 200 may perform the primary annealing process, and when the primary annealing process is completed, the bonding device 200 may perform the bonding process again.

When the primary annealing process is completed, the transferer 300 to be described below may stack the substrate wafers W2 in a plurality of layers. For example, the transferer 300 may take out the substrate wafers W2 from the pre-annealing oven 230 and stack the substrate wafers W2 on the load port LP of the wafer supplier 100.

In an embodiment, the bonding device 200 may include a first bonding device 200A and a second bonding device 200B. For example, as shown in FIG. 1, the first bonding device 200A and the second bonding device 200B may be arranged to be adjacent to each other on one side of the hybrid bonding apparatus 10 with respect to the transferer 300. In addition, the first bonding device 200A and the second bonding device 200B may be arranged to face each other with respect to the pretreatment device 600 to be described below.

The transferer 300 may transfer a wafer W between the plurality of chambers and transfer a bonded wafer W to the annealing chamber AC. For example, as shown in FIG. 1, the transferer 300 may be between the wafer supplier 100 and the bonding device 200.

In an embodiment, the transferer 300 may include a plurality of mobile robots 310. Although FIG. 1 illustrates only a first mobile robot 310A and a second mobile robot 310B, the number of mobile robots is not limited thereto. The mobile robots 310 may move along rails of the transferer 300 and may transfer the wafer W between the wafer supplier 100, the bonding device 200, the cleaner 400, and the pretreatment device 600 according to each process.

Figure 6:
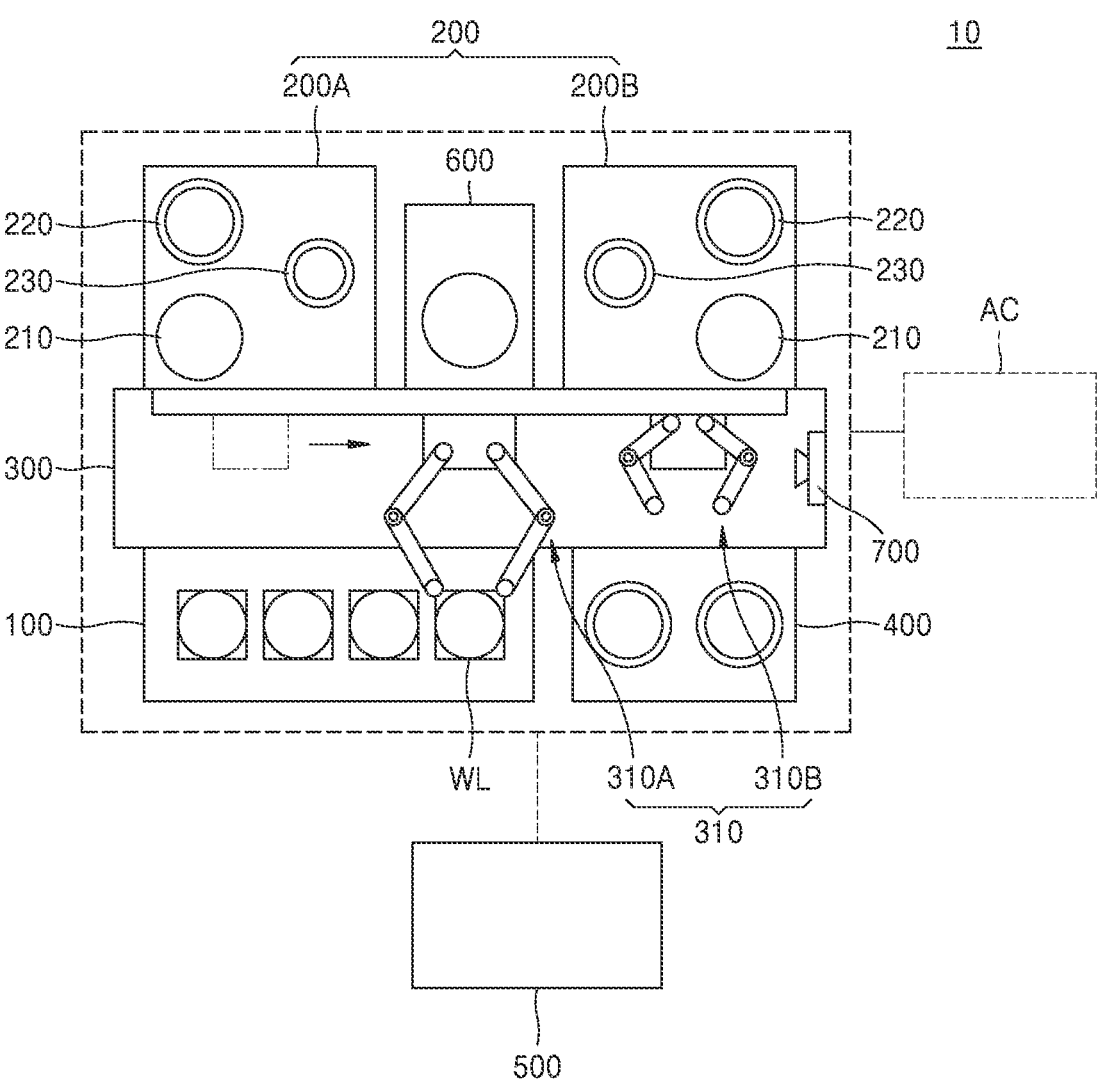

In an embodiment, as shown in FIG. 6, the transferer 300 may stack the substrate wafers W2 to which the dies D are bonded, on the load port LP of the wafer supplier 100 in a plurality of layers. For example, the transferer 300 may stack the substrate wafers W2 in 16 layers.

In an embodiment, the transferer 300 may transfer the substrate wafers W2 to the annealing chamber AC. In more detail, as shown in FIG. 1, the transferer 300 may transfer, to the annealing chamber AC, the substrate wafers W2 stacked on the wafer supplier 100 in the plurality of layers. For example, the substrate wafers W2 may be stacked in 16 layers. In this case, the annealing chamber AC may be an annealing apparatus arranged outside the hybrid bonding apparatus 10.

The annealing chamber AC performs secondary annealing on the substrate wafers W2 stacked in the plurality of layers. In an embodiment, a secondary annealing temperature may be higher than a primary annealing temperature, and a secondary annealing time may be longer than a primary annealing time. In more detail, the secondary annealing temperature may be about 250° C. to about 350° C., and the secondary annealing time may be about 1 hour to about 3 hours. According to another embodiment, the secondary annealing temperature may be 300° C., and the secondary annealing time may be 2 hours.

Accordingly, the primarily annealed substrate wafer W2 is secondarily annealed in the annealing chamber AC, and metals (e.g., Cu) expand in a via hole, and accordingly, a stronger bond between metals may be formed.

The cleaner 400 may clean the wafer W. For example, as shown in FIG. 1, the cleaner 400 may be arranged to be adjacent to the wafer supplier 100 on the same side as the wafer supplier 100 with respect to the transferer 300, and may also be arranged to face the bonding device 200. In addition, the cleaner 400 may include a cleaning area 410 on which the wafer W is mounted during a cleaning process. In this case, the cleaning area 410 may be formed as a plurality of cleaning areas to correspond to different wafers W. For example, a first cleaning area 410A may correspond to the die supply wafer W1, and a second cleaning area 4106 may correspond to the substrate wafer W2.

Figure 3:
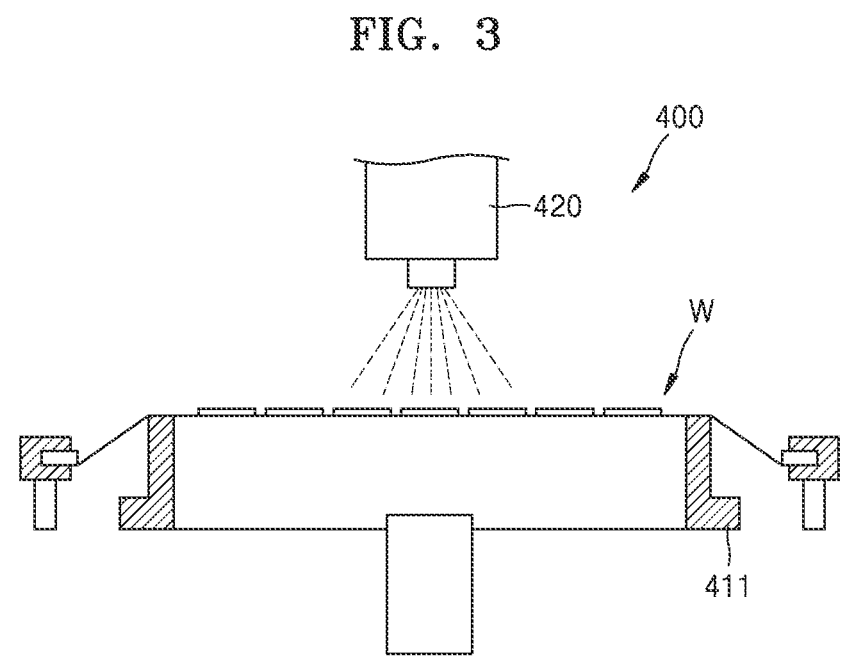

In an embodiment, the cleaner 400 may include a spray nozzle 420. For example, as shown in FIG. 3, the cleaner 400 may perform the cleaning process by spraying a cleaning fluid on the wafer W through the spray nozzle 420, the wafer W being supported by a supporter 411 provided in the cleaning area 410. In an embodiment, the cleaning fluid may be deionized water.

In an embodiment, the cleaner 400 may be used to clean the die supply wafer W1 and the substrate wafer W2. For example, before the bonding process is performed by the bonding device 200, the cleaner 400 may perform the cleaning process by receiving the die supply wafer W1 and/or the substrate wafer W2 from the wafer supplier 100. According to another embodiment, the cleaner 400 may perform the cleaning process on the bonded and primarily annealed substrate wafer W2.

The pretreatment device 600 may perform surface treatment on the wafer W. For example, as shown in FIG. 1, the pretreatment device 600 may be arranged to be adjacent to the bonding device 200. In more detail, the pretreatment device 600 may be between the first bonding device 200A and the second bonding device 200B. In an embodiment, the pretreatment device 600 may activate the surface through plasma. In this case, the pretreatment device 600 may perform pretreating on the wafer W after cleaning or may perform pretreating on the wafer W before cleaning.

In an embodiment, the pretreatment device 600 may activate the surface by performing plasma treatment on the surface of the substrate wafer W2 cleaned by the cleaner 400.

In an embodiment, the cleaner 400 and the pretreatment device 600 may respectively perform a cleaning process and a pretreating process on the primarily annealed substrate wafer W2. For example, when the primary annealing process is completed by the pre-annealing oven 230, the transferer 300 may transfer the substrate wafer W2 to the pretreatment device 600 and perform the pretreating process. Next, the substrate wafer W2 may be transferred to the cleaner 400 by the transferer 300 and cleaned, and the transferer 300 may stack the substrate wafers W2 on the wafer supplier 100 again.

The controller 500 may control other components of the hybrid bonding apparatus 10. For example, the controller 500 may be connected to other components, i.e., the wafer supplier 100, the bonding device 200, the transferer 300, the cleaner 400, the pretreatment device 600, and the aligner 700 to be described below, included in the hybrid bonding apparatus 10, by wire or wirelessly and may control these components.

The controller 500 may include a computing device such as a workstation computer, a desktop computer, a laptop computer, or a tablet computer. The controller may include a simple controller, a microprocessor, a complex processor such as a central processing unit (CPU) or a graphics processing unit (GPU), a processor configured by software, or dedicated hardware or firmware. For example, the controller and the processor may be implemented by a general-use computer or an application-specific hardware component such as a digital signal processor (DSP), a field programmable gate array (FPGA), or an application-specific integrated circuit (ASIC).

In an embodiment, when a plurality of bonding devices 200 are provided, the controller 500 may control the bonding process and the primary annealing process performed by different bonding devices 200 to be completed simultaneously. In more detail, the controller 500 may predict the time at which the bonding process is completed by the first bonding device 200A. For example, the controller 500 may predict the time at which the bonding process is completed by the first bonding device 200A, based on information regarding the time and distance that the picker 210 and the bonder 220 move, the time (pressing time) required for the bonder 220 to press the die D on the substrate wafer W2, a wafer map indicating the wafer quality of the substrate wafer W2, and the speeds and accelerations of other drivers.

In addition, the controller 500 may control a primary annealing condition so that the primary annealing process is completed by the second bonding device 200B according to an expected bonding completion time. In particular, the controller 500 may calculate the expected bonding completion time again even while the bonding process and the primary annealing process are performed. When an initially calculated first expected time is different from a re-calculated second expected time, the controller 500 may modify the primary annealing condition according to the second expected time. For example, when the second expected time is faster than the first expected time, the controller 500 may control the bonding process in the first bonding device 200A and the primary annealing process in the second bonding device 200B to be completed simultaneously, by reducing the time required, instead of increasing the temperature in the primary annealing process.

The aligner 700 is arranged on one side of the transferer 300 and senses a state in which the wafer W is gripped by the transferer 300 in real time. The type of aligner 700 is not particularly limited and may be an optical camera or a laser sensor. When the aligner 700 senses that the wafer W is incorrectly gripped by the transferer 300, the aligner 700 transmits such information to the controller 500, and the controller 500 may control the operation of the transferer 300.

Next, the hybrid bonding method according to an embodiment of the disclosure is described with reference to FIGS. 1 to 6. According to an embodiment of the disclosure, the hybrid bonding method may include supplying, by the wafer supplier 100, a plurality of wafers W including a substrate wafer W2 and a die supply wafer W1 to the bonding device 200, bonding, by the bonding device 200, a die D on the substrate wafer W2 from the die supply wafer W1, primarily annealing, by the bonding device 200, the bonded substrate wafer W2, and transferring, by the transferer 300, the primarily annealed substrate wafer W2 to the annealing chamber AC for secondary annealing.

First, the transferer 300 transfers wafers W stored in the wafer supplier 100 to the pretreatment device 600. The pretreatment device 600 may activate the surfaces of the wafers W, more particularly, the die supply wafer W1 and/or the substrate wafer W2, through plasma treatment.

Next, the transferer 300 transfers the pretreated wafer W to the cleaner 400, and the cleaner 400 cleans the surfaces of the wafers W, more particularly, the die supply wafer W1 and/or the substrate wafer W2, by using a cleaning fluid (e.g., deionized water).

In this case, it has been described that the plasma process is performed before the cleaning process, but embodiments not limited thereto. For example, the cleaning process may be performed before the plasma process.

Next, the transferer 300 transfers the die supply wafer W1 and the substrate wafer W2 to the bonding device 200.

The bonding device 200 may pick up the die D from the die supply wafer W1 by using the picker 210 and may bond the picked-up die D on the substrate wafer W2 by using the bonder 220. In this case, the bonder 220 may form a covalent bond between oxides (e.g., $SiO_2$) by pressing the die D on the substrate wafer W2. For example, the bonding process may be $Cu$—$SiO_2$ hybrid bonding. In addition, the bonder 220 may bond all of dies D to a preset area on the substrate wafer W2.

Next, the bonding device 200 may primarily anneal the substrate wafer W2 to which the die D is bonded, by using the pre-annealing oven 230. In an embodiment, the primarily annealing may include performing primary annealing at a temperature lower than a secondary annealing temperature and for a time shorter than a secondary annealing time in the annealing chamber AC. For example, the primary annealing may be performed at about 100° C. to 150° C. for about 5 minutes to about 10 minutes. According to another embodiment, the primary annealing may be performed at 120° C. for 10 minutes.

In an embodiment, the primarily annealing may be performed at a predetermined temperature and for a predetermined time so that chip fly does not occur in processes after the primary annealing.

In an embodiment, the primarily annealing may further include checking, by the bonding device 200, mounting precision of the substrate wafer W2 or inspecting the presence of foreign materials. For example, in the primarily annealing, the pre-annealing oven 230 may simultaneously perform checking the mounting precision and/or inspecting the presence of foreign materials by using the inspection device 231, while the primary annealing is performed.

In an embodiment, a plurality of bonding devices 200 may be provided. In addition, the bonding and the primarily annealing may be simultaneously performed by different bonding devices 200. For example, when the bonding process is performed by one bonding device 200, and the primary annealing process may be simultaneously performed by another bonding device 200.

In an embodiment, the bonding process and the primary annealing process simultaneously performed by different bonding devices 200 may be completed at the same time.

In an embodiment, the bonding device 200 may include a first bonding device 200A and a second bonding device 200B. In addition, the controller 500 may predict the time at which the bonding process is completed by the first bonding device 200A, and may control a condition of the primary annealing process so that the primary annealing process is completed by the second bonding device 200B according to an expected bonding completion time.

Next, the transferer 300 transfers the primarily annealed substrate wafer W2 to the pretreatment device 600. The pretreatment device 600 activates the surface by performing plasma treatment on the primarily annealed substrate wafer W2.

Next, the transferer 300 transfers the pretreated substrate wafer W2 to the cleaner 400. The cleaner 400 performs the cleaning process by spraying the cleaning fluid to the pretreated substrate wafer W2.

Next, the transferer 300 stacks the cleaned substrate wafers W2 in a plurality of layers. In more detail, the transferer 300 may stack the substrate wafers W2 on the load port LP of the wafer supplier 100 in a plurality of layers (e.g., 16 layers).

Next, the transferer 300 may transfer the substrate wafers W2 stacked in the plurality of layers to the annealing chamber AC. The annealing chamber AC may perform secondary annealing on the stacked substrate wafers W2. In an embodiment, the secondary annealing temperature may be about 250° C. to about 350° C., and the secondary annealing time may be about 1 hour to about 3 hours. According to another embodiment, the secondary annealing temperature may be 300° C., and the secondary annealing time may be 2 hours. Accordingly, the primarily annealed substrate wafers W2 are secondarily annealed in the annealing chamber AC, and metals (e.g., Cu) expand in a via hole, and accordingly, a strong bond between metals may be formed.

Through the configuration as described above, according to the embodiments of the disclosure, in the hybrid bonding apparatus 10 and the hybrid bonding method using the same, after the bonder 220 presses and primarily bonds the die D on the substrate wafer W2, the substrate wafer W2 is not immediately transferred to the annealing chamber AC but is primarily annealed in the pre-annealing oven 230, and thus, a chip fly phenomenon may be prevented.

In addition, according to the embodiments of the disclosure, in the hybrid bonding apparatus 10 and the hybrid bonding method using the same, because the picker 210, the bonder 220, and the pre-annealing oven 230 are all included in one bonding device 200, the time required for each process may be significantly reduced.

In addition, according to the embodiments of the disclosure, in the hybrid bonding apparatus 10 and the hybrid bonding method using the same, by linking the bonding process and the primary annealing process performed by each of the plurality of bonding devices 200 to each other, the productivity of the entire hybrid bonding process may be increased.

According to the embodiments of the disclosure, in the hybrid bonding apparatus and the hybrid bonding method using the same, primary annealing is performed by a pre-annealing oven, and thus, a chip fly phenomenon may be prevented.

In addition, according to the embodiments of the disclosure, in the hybrid bonding apparatus and the hybrid bonding method using the same, a picker, a bonder, and a pre-annealing oven are all included in one bonding device, and thus, the time required for each process may be significantly reduced.

In addition, according to the embodiments of the disclosure, in the hybrid bonding apparatus and the hybrid bonding method using the same, by linking the bonding process and the primary annealing process performed by each of a plurality of bonding devices to each other, the productivity of the entire hybrid bonding process may be increased.

As described above, the disclosure has been described with reference to the embodiments illustrated in the drawings, but this is merely an example. Those of ordinary skill in the art will fully understand that various modifications and other equivalent embodiments can be made from the embodiments. Therefore, the scope of the protection of the technology of the disclosure should be determined by the appended claims and their equivalents.

Specific technical descriptions in the embodiments are example embodiments and do not limit the technical scope of the embodiments. In order to concisely and clearly describe the disclosure, descriptions of general techniques and configurations of the related art may be omitted. In addition, connections or connection members of lines between elements illustrated in the drawings are examples of functional connections and/or physical or circuit connections, and may be represented by various alternative or additional functional connections, physical connections, or circuit connections in an actual apparatus. In addition, unless specifically stated as "essential" or "importantly", an element may not be a necessary element for the application of the disclosure.

The term "above" or similar referring expressions used in the description and claims of the disclosure may refer to both the singular and plural expressions unless otherwise specified. In addition, when a range is described in the embodiments, it indicates that embodiments to which individual values belonging to the range are applied are also included (unless otherwise stated), it is the same as each individual value constituting the range is described in the detailed description of the disclosure. Moreover, steps or operations constituting the method according to the embodiments may be performed in an appropriate order, if the order is explicitly stated or unless otherwise stated. The embodiments are not necessarily limited according to the order of the description of the steps or operations. All examples or illustrative terms (e.g., etc.) in the embodiments are merely used to describe the embodiments in detail, and the scope of the embodiments is limited by the examples or illustrative terms unless limited by the claims. In addition, those of ordinary skill in the art will appreciate that various modifications, combinations, and changes can be made in accordance with design conditions and factors within the scope of the appended claims or equivalents thereof.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope included in the following claims and their equivalents.

What is claimed is:

1. A hybrid bonding apparatus comprising:
   a plurality of chambers; and
   a transferer configured to transfer a plurality of wafers between the plurality of chambers and transfer a plurality of bonded wafers to an annealing chamber, the plurality of wafers comprising a plurality of substrate wafers and a plurality of die supply wafers,
   wherein at least one of the plurality of chambers comprises:
   a wafer supplier configured to store the plurality of wafers; and
   a bonding device configured to bond the plurality of wafers, the bonding device comprising:
   a bonder configured to bond dies on the plurality of substrate wafers from the plurality of die supply wafers; and
   a pre-annealing oven configured to primarily anneal the plurality of bonded substrate wafers, and
   wherein the annealing chamber is configured to secondary anneal the plurality of primarily annealed substrate wafers,
   wherein the bonding device comprises a plurality of bonding devices,
   wherein when a bonding process is performed by a bonder included in a bonding device among the plurality of bonding devices, a primary annealing process is simultaneously performed by a pre-annealing oven included in another bonding device among the plurality of bonding devices, and
   wherein the bonding process and the primary annealing process simultaneously performed by different bonding devices are completed at the same time.

2. The hybrid bonding apparatus of claim 1, wherein the plurality of chambers respectively further comprise:
   a pretreatment device configured to pretreat a plurality of bonded substrate wafers to be activated; and
   a cleaner configured to clean the plurality of substrate wafers.

3. The hybrid bonding apparatus of claim 2, wherein the bonding device is further configured to bond and primarily anneal the dies on the plurality of substrate wafers from the plurality of die supply wafers pretreated and cleaned by the pretreatment device and the cleaner, and
   wherein the pretreatment device and the cleaner are respectively configured to pretreat and clean the plurality of primarily annealed substrate wafers.

4. The hybrid bonding apparatus of claim 1, wherein the bonding is copper-silicon dioxide ($Cu$—$SiO_2$) hybrid bonding.

5. The hybrid bonding apparatus of claim 1, wherein the primarily annealing is performed at a predetermined temperature and for a predetermined time, and
   wherein the predetermined temperature is lower than a temperature of secondary annealing in the annealing chamber, and the predetermined time is shorter than a time of the secondary annealing.

6. The hybrid bonding apparatus of claim 1, wherein the transferer is configured to stack the plurality of primarily annealed substrate wafers in a plurality of layers, and transfer the plurality of substrate wafers to the annealing chamber for secondary annealing.

7. The hybrid bonding apparatus of claim 1, wherein the pre-annealing oven comprises an inspection device configured to check mounting precision of the plurality of substrate wafers or check presence of foreign materials during the primarily annealing.

8. A hybrid bonding apparatus comprising:

a plurality of chambers; and a transferer configured to transfer a plurality of wafers between the plurality of chambers and transfer a plurality of bonded wafers to an annealing chamber, the plurality of wafers comprising a plurality of substrate wafers and a plurality of die supply wafers, wherein at least one of the plurality of chambers comprises:

a wafer supplier configured to store the plurality of wafers; and a bonding device configured to bond the plurality of wafers, the bonding device comprising:

a bonder configured to bond dies on the plurality of substrate wafers from the plurality of die supply wafers; and a pre-annealing oven configured to primarily anneal the plurality of bonded substrate wafers, and wherein the annealing chamber is configured to secondary anneal the plurality of primarily annealed substrate wafers, wherein the bonding device comprises a plurality of bonding devices, wherein when a bonding process is performed by a bonder included in a bonding device among the plurality of bonding devices, a primary annealing process is simultaneously performed by a pre-annealing oven included in another bonding device among the plurality of bonding devices, wherein the bonding device comprises a first bonding device and a second bonding device, and wherein the hybrid bonding apparatus further comprises a processor configured to predict a time at which the bonding process is completed by the first bonding device, and control a condition of the primary annealing process such that the primary annealing process is completed by the second bonding device based on an expected bonding completion time.

9. A hybrid bonding method comprising:

supplying, by a wafer supplier, a plurality of wafers comprising a plurality of substrate wafers and a plurality of die supply wafers to a bonding device;

bonding, by the bonding device, dies on the plurality of substrate wafers from the plurality of die supply wafers;

primarily annealing, by the bonding device, the plurality of bonded substrate wafers;

transferring, by a transferer, the plurality of primarily annealed substrate wafers to an annealing chamber for secondary annealing; and secondary annealing, by the annealing chamber, the plurality of primarily annealed substrate wafers, wherein the bonding device comprises a plurality of bonding devices, and wherein the bonding and the primarily annealing are simultaneously performed by different bonding devices among the plurality of bonding devices.

10. The hybrid bonding method of claim 9, further comprising:

pretreating, by a pretreatment device, the plurality of primarily annealed substrate wafers to be activated; and cleaning, by a cleaner, the plurality of substrate wafers.

11. The hybrid bonding method of claim 10, wherein, before the bonding, the hybrid bonding method further comprises pretreating, by the pretreatment device, the plurality of die supply wafers and cleaning, by the cleaner, the plurality of pretreated die supply wafers, wherein the bonding comprises bonding the plurality of pretreated and cleaned die supply wafers to the plurality of substrate wafers, and wherein, after the primarily annealing, the hybrid bonding method further comprises pretreating, by the pretreatment device, the plurality of substrate wafers and cleaning, by the cleaner, the plurality of pretreated substrate wafers.

12. The hybrid bonding method of claim 9, wherein the bonding and the primary annealing simultaneously performed by the different bonding devices are completed at the same time.

13. The hybrid bonding method of claim 9, wherein the bonding device comprises a first bonding device and a second bonding device, and wherein the hybrid bonding method further comprises predicting, by a processor, a time at which the bonding is completed by the first bonding device, and controlling a condition of the primary annealing such that the primary annealing is completed by the second bonding device based on an expected bonding completion time.

14. The hybrid bonding method of claim 9, wherein the bonding is copper-silicon dioxide (Cu—SiO$_2$) hybrid bonding.

15. The hybrid bonding method of claim 9, wherein the primarily annealing is performed at a predetermined temperature and for a predetermined time, and wherein the predetermined temperature is lower than a temperature of secondary annealing, and the predetermined time is shorter than a time for the secondary annealing.

16. The hybrid bonding method of claim 9, further comprising stacking, by the transferer, the plurality of primarily annealed substrate wafers in a plurality of layers and transferring the plurality of stacked substrate wafers to the annealing chamber for secondary annealing.

17. The hybrid bonding method of claim 9, wherein the primarily annealing further comprises performing, by the bonding device, inspection by checking mounting precision of the plurality of substrate wafers and checking presence of foreign materials.

* * * * *